United States Patent
Yu et al.

(10) Patent No.: US 9,798,851 B2
(45) Date of Patent: Oct. 24, 2017

(54) METHOD OF DESIGN RULE CHECK FOR OFF-GRID IRREGULAR LAYOUT WITH ON-GRID DESIGN RULE CHECK DECK

(71) Applicant: SEMICONDUCTOR MANUFACTURING INTERNATIONAL (SHANGHAI) CORPORATION, Shanghai (CN)

(72) Inventors: Shaofeng Yu, Shanghai (CN); Yihua Shen, Shanghai (CN); Jian Pan, Shanghai (CN); Fenghua Fu, Shanghai (CN); Yunchu Yu, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 15/015,030

(22) Filed: Feb. 3, 2016

(65) Prior Publication Data

US 2016/0224719 A1    Aug. 4, 2016

(30) Foreign Application Priority Data

Feb. 4, 2015    (CN) .......................... 2015 1 0058670

(51) Int. Cl.
 *G06F 17/50*    (2006.01)
 *G06F 9/455*    (2006.01)

(52) U.S. Cl.
 CPC ................. *G06F 17/5081* (2013.01)

(58) Field of Classification Search
 CPC .................................................. G06F 17/5081
 USPC .......................................................... 716/112
 See application file for complete search history.

(56) References Cited

U.S. PATENT DOCUMENTS

| | | | |
|---|---|---|---|
| 9,087,174 B1 * | 7/2015 | Zhang | G06F 17/5081 |
| 9,286,432 B1 * | 3/2016 | Gerousis | G06F 17/5077 |
| 2006/0036977 A1 * | 2/2006 | Cohn | G06F 17/5072 716/51 |
| 2008/0229259 A1 * | 9/2008 | Wang | G06F 17/5068 716/132 |
| 2009/0228853 A1 * | 9/2009 | Hong | G06F 17/5068 716/119 |
| 2009/0235215 A1 * | 9/2009 | Lavin | G06F 17/5077 716/106 |
| 2010/0175034 A1 * | 7/2010 | Tsurumoto | G06F 17/5081 716/55 |
| 2010/0229140 A1 * | 9/2010 | Strolenberg | G06F 17/5072 716/52 |
| 2013/0138682 A1 * | 5/2013 | Zhu | G06F 17/30241 707/769 |

* cited by examiner

*Primary Examiner* — Suresh Memula
(74) *Attorney, Agent, or Firm* — Kilpatrick Townsend & Stockton LLP

(57) ABSTRACT

A method for DRC verification of a design layout file comprising off-grid patterns includes identifying an off-grid pattern having one or more off-grid sides, outwardly expanding the one or more off-grid sides to adjacent grids to obtain a first on-grid pattern, inwardly contracting the expanded one or more sides of the first on-grid pattern to adjacent grids to obtain a second on-grid pattern, and performing a DRC verification on the second on-grid pattern using an existing on-grid DRC deck. The method also includes making a backup copy of the design layout file prior to converting the identified off-grid pattern into an on-grid pattern.

10 Claims, 5 Drawing Sheets

METHOD OF DESIGN RULE CHECK FOR OFF-GRID IRREGULAR LAYOUT WITH ON-GRID DESIGN RULE CHECK DECK

CROSS-REFERENCES TO RELATED APPLICATIONS

The present application claims priority to Chinese patent application No. 201510058670.3, filed with the State Intellectual Property Office of People's Republic of China on Feb. 4, 2015 the content of which is incorporated herein by reference in its entirety.

BACKGROUND OF THE INVENTION

The present invention relates to integrated circuit design. More particularly, embodiments of the present invention relate to a method for performing a design rule check (DRC) on a layout design.

As integrated circuit (IC) technology advances, the complexity of IC designs increases, there is a need to satisfy the increase in design restrictions. In some cases, the design constraints are very strict, for example, in order to satisfy the performance requirements of a conventional layout design method, the layout of each pattern should be on grid. The term "on-grid pattern" means a pattern having the boundaries or edges arranged on the grid lines. Conversely, the term "off-grid pattern" means a pattern having the boundaries or edges not arranged on the grid lines. FIGS. 1A-1C show examples of layout patterns that are on-grid in the related art. These patterns may be portions of an IC layout and have polygonal shapes with boundaries (edges) arranged on the grid lines. The grid lines are shown as vertical lines 111 and have a grid interval (e.g., horizontal space 112) between them, as shown in FIGS. 1A-1C.

Under normal circumstances, when performing a design rule check on a layout design, the boundaries (edges) of each layout pattern of the layout design must be on-grid, otherwise off-grid errors will show up as the result of the DRC verification, and correction will be made to the off-grid boundaries (i.e., edges that are not arranged on the grid lines) to bring them back to on-grid.

However, as IC technology advances, on-grid layout patterns (i.e., all boundaries or edges of the layout patterns are on-grid) are not being able to satisfy the demand for the speed requirements of advanced technology devices. In some cases, off-grid layout patterns (i.e., at least a portion of the layout pattern is off-grid) may be required to ensure the device performance. FIGS. 2A-2D show examples of off-grid layout patterns having vertical edges 122 not arranged on the grid lines 111.

The current layout practice is to reduce the unit size (grid interval) of the grid to the next smaller size, for example, the 5 nm grid interval is reduced to 1 nm to satisfy the actual design layout requirements, i.e., the requirement of a particular pattern is satisfied and no off-grid errors will occur when running the DRC verification. However, this method only allows a limited number of specific patterns to be off-grid, and most of the layout patterns are to be on-grid.

For conventional off-grid layout designs, if a DRC verification is performed using an existing on-grid DRC deck, off-grid errors will occur. The term DRC deck means a computer file that contains DRC rules. Thus, there is a need to perform the DRC verification on off-grid patterns using an existing on-grid DRC deck without causing occurrence of off-grid errors.

BRIEF SUMMARY OF THE INVENTION

Embodiments of the present invention relate to a method and system for performing a design rule check (DRC) verification of an integrated circuit layout containing one or more off-gird patterns, where one or more boundaries or edges are not arranged on the grid.

In one embodiment, a computer-implemented method is provided for performing a design rule check (DRC) verification on a layout design containing one or more off-grid patterns and one or more on-grid patterns. The method includes identifying an off-grid pattern having one or more off-grid edges using a computer, outwardly expanding the one or more off-grid edges to first adjacent grid lines to obtain a first on-grid pattern having first on-grid edges, inwardly contracting the first on-grid edges of the first on-grid pattern to second adjacent grid lines to obtain a second on-grid pattern having second on-grid edges, and performing a DRC verification on the second on-grid pattern using the computer.

In one embodiment, the off-grid pattern is identified with the use of software tools that can be accessed and operated by the computer.

In one embodiment, the method may further include labeling the identified off-grid pattern.

In one embodiment, the method also includes forming a set of on-grid patterns comprising the first on-grid pattern and the second on-grid pattern, and labeling the set of on-grid patterns.

In one embodiment, a sum of a first width of the first on-grid pattern and a second width of the second on-grid pattern that have a same height is about two times a width of the off-grid pattern corresponding to the same height.

In one embodiment, edges of the off-grid pattern that are on-grid are not outwardly expanded or inwardly contracted.

In one embodiment, no expansion or contraction is performed on the on-grid patterns.

In one embodiment, the DRC verification is performed using a DRC file containing only on-grid design rules.

In one embodiment, the method further includes performing a backup of the layout design after identifying the off-grid pattern and prior to expanding the off-grid edges.

In one embodiment, the computer automatically performs the backup by making a backup copy, and storing the backup copy in a backup storage.

Embodiments of the present invention also provide a non-transitory computer readable storage medium for performing a DRC verification on an IC layout design that includes a plurality of off-grid patterns and on-grid patterns. The computer readable storage medium includes instructions which, when executed by a processor, cause the processor to identify an off-grid pattern having one or more off-grid edges, outwardly expand the one or more off-grid edges to first adjacent grid lines to obtain a first on-grid pattern having first on-grid edges, inwardly contract the first on-grid edges of the first on-grid pattern to second adjacent grid lines to obtain a second on-grid pattern having second on-grid edges, and perform a DRC verification on the second on-grid pattern.

The following description, together with the accompanying drawings, will provide a better understanding of the nature and advantages of the claimed invention.

DETAILED DESCRIPTION OF THE INVENTION

Figure 1A:
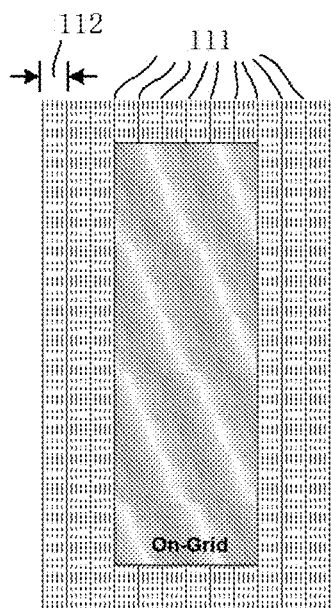
FIGS. 1A-1C show a plan view of on-grid layout pattern examples in the related art.
Figure 1B:
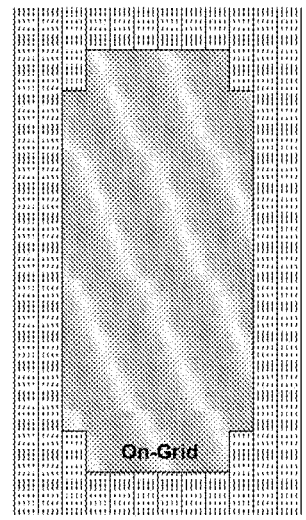
Figure 1C:
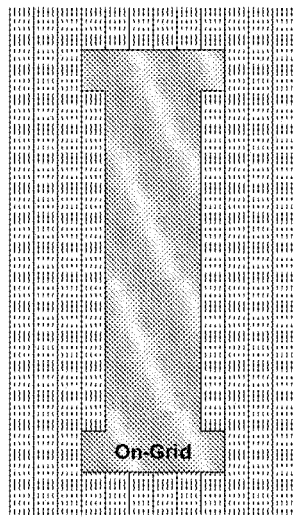
Figure 2A:
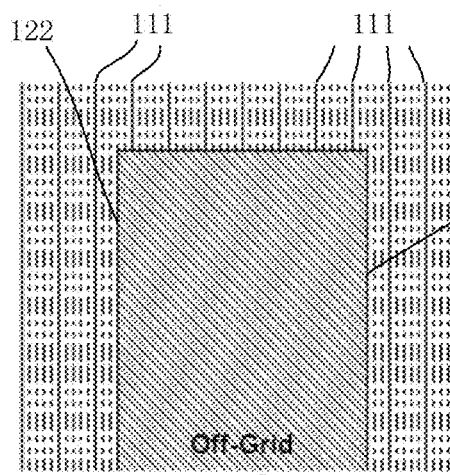
FIGS. 2A-2D show off-grid layout pattern examples in the related art.
Figure 2B:
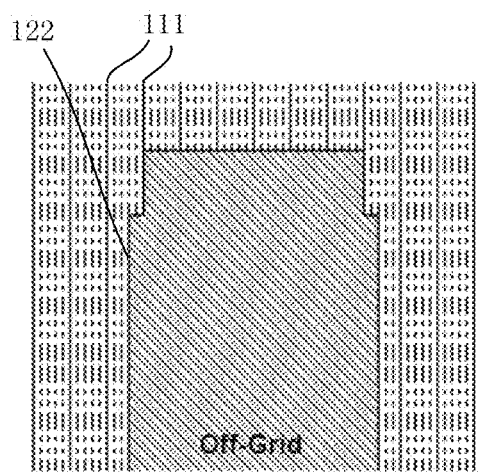
Figure 2C:
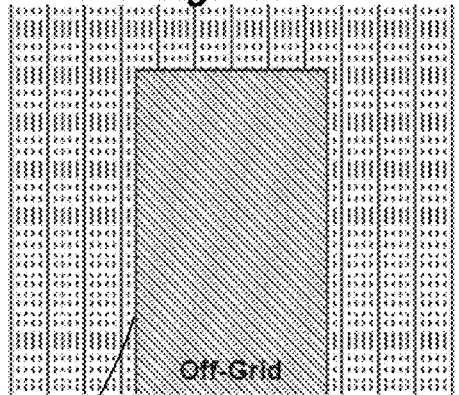
Figure 2D:
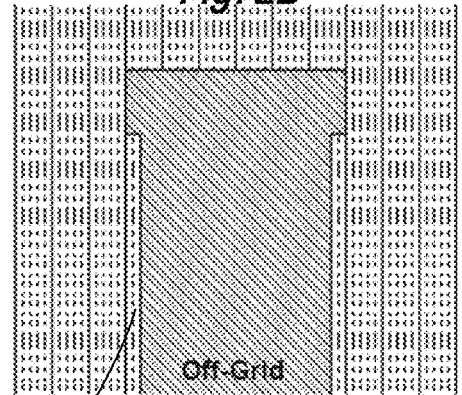

The present invention is best understood from the following detailed description when read with the accompanying drawing figures. In the following detailed description, for purposes of explanation and not limitation, example embodiments disclosing specific details are set forth in order to provide a thorough understanding of the present invention. However, descriptions of well-known devices, methods and materials may be omitted so as to not obscure the description of the present invention.

It will be appreciated that for simplicity and clarity of illustration, elements shown in the Figures have not necessarily been drawn to scale. For example, the dimensions of some of the elements are exaggerated relative to each other for clarity. Further, where considered appropriate, reference numerals have been repeated among the Figures to indicate corresponding elements.

As used herein, the terms "example embodiment," "exemplary embodiment," and "present embodiment" do not necessarily refer to a single embodiment, although it may, and various example embodiments may be readily combined and interchanged, without departing from the scope or spirit of the present invention. Furthermore, the terminology as used herein is for the purpose of describing example embodiments only and is not intended to be a limitation of the invention. In this respect, as used herein, the term "in" may include "in" and "on", and the terms "a", "an" and "the" may include singular and plural references.

It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof.

The present invention will now be described more fully herein after with reference to the accompanying drawings, in which preferred embodiments of the invention are shown. This invention may, however, be embodied in many different forms and should not be construed as limited by the embodiments set forth herein. Rather, these embodiments are provided so that this disclosure will be thorough and complete, and will fully convey the scope of the invention to those skilled in the art.

The present invention relates to a method for performing a DRC verification of a layout design. More particularly, embodiments of the present invention provide a DRC verification method of off-grid layout patterns using an on-grid DRC deck.

In accordance to the present invention, the verification method allows a designer to design complex off-grid patterns to replace the original requirements of on-grid layout patterns, without the need of modifying the on-grid design rules.

Figure 3:
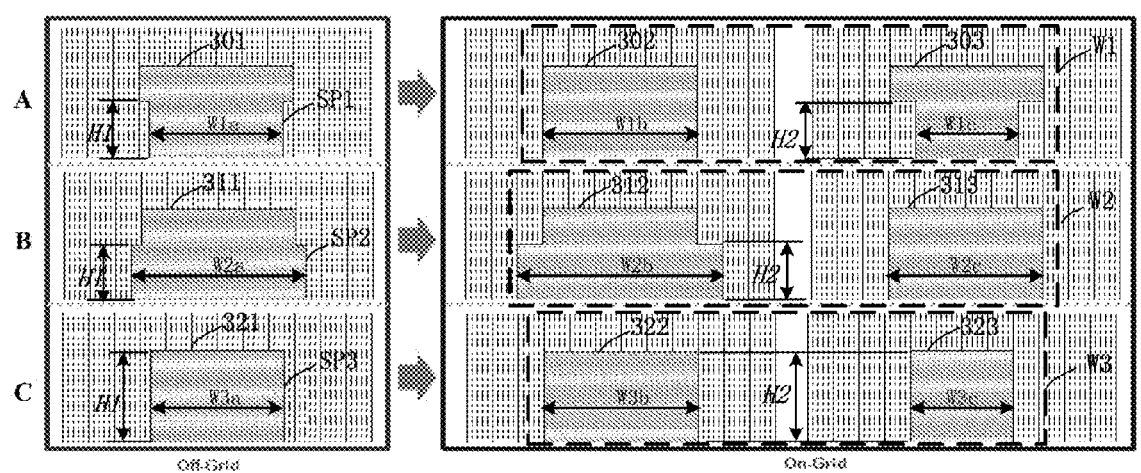
FIG. 3 shows exemplary stages of a conversion of off-grid patterns to on-grid patterns according to an embodiment of the present invention.
Figure 4:
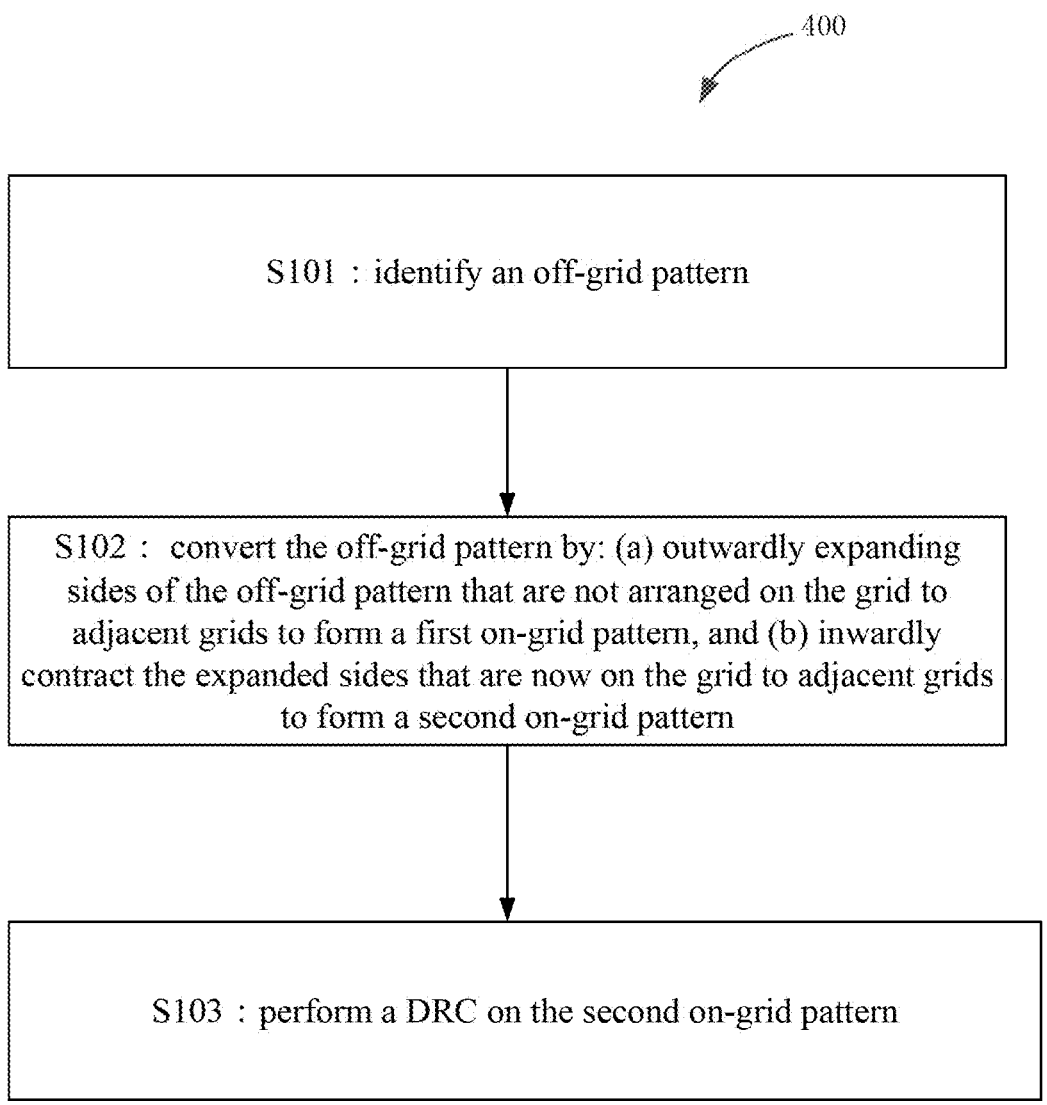
FIG. 4 is a flow chart illustrating a method of performing a DRC verification of a pattern according to an embodiment of the present invention.

FIG. 3 shows exemplary stages of a conversion of an off-grid pattern to two on-grid patterns for a DRC verification according to an embodiment of the present invention. FIG. 4 is a flow chart illustrating a method of performing a DRC verification of a layout design according to an embodiment of the present invention.

In one embodiment, a method for performing a DRC verification of a layout design containing off-grid layout patterns may include the following steps:

Step 1: identify an off-grid layout pattern (alternatively referred to as "off-grid pattern") in the layout design. The identified off-grid layout pattern includes at least one segment or portion having an edge that is not arranged on the grid.

In the embodiment, the off-grid layout pattern may be identified using software tools or other appropriate processes and techniques. An off-grid pattern may be a design pattern or a portion of the design pattern having special physical sizes or dimensions. This step may also include labeling the identified off-grid layout pattern. Illustratively, the identified off-grid patterns may be labeled SP1, SP2, . . . , SPn, where n is an integer number of the identified patterns having special sizes. The off-grid pattern has one or more edges that are not arranged on the grid.

Step 2: convert the identified off-grid layout pattern into two on-grid patterns according to the following operations: (a) outwardly expand edges of the off-grid pattern that are not arranged on the grid to the adjacent grids to form a first on-grid pattern, and (b) inwardly contract the expanded edges that are now on the grid to the adjacent grids to form a second on-grid pattern.

It is noted that, in these expanding and contracting operations, the edges of the off-grid pattern that are originally arranged on the grid (if they are present) remain unchanged, i.e., the originally on-grid edges of the off-grid pattern are not converted in step 2.

After the above-described conversion, the sum of the width of the two segments (portions) of the two respective on-grid patterns is about two times the width of the segment (portion) of the off-grid pattern corresponding to the same height.

FIG. 3 shows examples of a conversion of an off-grid pattern into an on-grid pattern for a DRC verification according to an embodiment of the present invention. Referring to FIG. 3, three examples of the conversion of off-grid patterns into corresponding on-grid patterns according to an embodiment of the present invention are shown. FIG. 3 includes three parts: a top part A, a middle part B, and a bottom part C. The top part A shows an off-grid pattern 301 that includes an upper on-grid portion having its opposite edges in the vertical direction arranged on the grid and a lower off-grid portion having its opposite vertical edges not arranged on the grid. The width of the off-grid portion is denoted W1a. In accordance with the present invention, the off-grid portion is converted by outwardly expanding its opposite edges to adjacent grids so that the off-grid edges of the pattern 301 are now arranged on the grid, i.e., the off-grid pattern 301 has been transformed to a converted first on-grid pattern 302 where the expanded lower portion has a width W1b. Next, the on-grid arranged edges of the first on-grid pattern 302 is inwardly contracting to the adjacent grids, so that the first on-grid pattern 302 is now converted into a second on-grid pattern 303 where the contracted lower portion has a width W1c. The sum of the widths W1b and W1c of the respective first and second on-grid patterns 302 and 303 having the same height H2 is about two times the width W1a of the lower off-grid portion of the pattern 301 having the height H1 corresponding to the same height H2.

Similarly, the middle part B of FIG. 3 shows an off-grid pattern 311 that includes an upper on-grid portion having its opposite sides arranged on the grid and a lower off-grid portion having its opposite sides not arranged on the grid. The width of the off-grid portion is denoted W2a. In accordance with the present invention, the off-grid portion is converted by outwardly expanding its opposite edges to adjacent grids so that the off-grid edges of the pattern 311 are now arranged on the grid, i.e., the off-grid pattern 311 has been converted into a first on-grid pattern 312 where the expanded lower portion has a width W2b. Next, the on-grid arranged edges of the first on-grid pattern 312 is inwardly contracted to the adjacent grids, so that the on-grid first pattern 312 is now converted into a second on-grid pattern 313 where the contracted lower portion has a width W2c. The sum of the widths W2b and W2c of the respective lower on-grid portions of the first and second on-grid patterns 312 and 313 having the same height H2 is about two times the width W2a of the lower off-grid portion of the pattern 311 having the height H1 corresponding to the same height H2.

Referring still to FIG. 3, the bottom part C shows an off-grid pattern 321 having its opposite edges in the vertical direction not arranged on the grid. The width of the off-grid pattern 321 is denoted W3a. In accordance with the present invention, the opposite edges of the off-grid pattern 321 are outwardly expanded to adjacent grids so that they are now arranged on the grid, i.e., the off-grid pattern 321 has been converted into a first on-grid pattern 322 where the expanded pattern has a width W3b. Next, the on-grid arranged edges of the first on-grid pattern 322 are inwardly contracted to the adjacent grids, so that the first on-grid pattern 322 is now converted into a second on-grid pattern 323 where the contracted pattern has a width W3c. The sum of the widths W2b and W2c of the respective on-grid patterns 322 and 323 having the same height H2 is about two times the width W3a of the off-grid pattern 321 having the height H1 corresponding to the same height h2 of on-grid patterns 322 and 323.

In an embodiment, the first and second on-grid patterns obtained from the conversion of the off-grid pattern form a set of on-grid patterns. The set of on-grid patterns replaces the off-grid pattern in the DRC verification, thereby preventing errors from occurring in the DRC verification.

In this step, the method may further include labeling each set of on-grid patterns. For example, the sets of on-grid patterns may be labeled W1, W2, . . . , Wn corresponding to the special sizes of off-grid pattern SP1, SP2, . . . , SPn, as shown in FIG. 3.

The converted sets of on-grid patterns have the same configurations as those of the other on-grid patterns present in the original layout design. Thus, there is no need to modify the existing DRC deck for performing the DRC verification.

In an embodiment, prior to performing the above-described step 1 or step 2, the method may also include a backup of the layout design. The backup of the layout design of an integrated circuit device prior to the layout pattern conversion ensures that the layout design can be used in the subsequent manufacturing of the integrated circuit device. The backup of the layout file can also ensure that, in the event that errors occur in the conversion of layout patterns, the conversion can be restarted using the backup layout file. In an exemplary embodiment, the backup operation of the layout file can be automatically performed by software tools running on a computer system.

The method also includes Step 3, which includes performing a DRC verification on the converted layout pattern. The converted layout pattern is referred to the layout pattern obtained after step 2. Examples of the converted layout pattern are shown as patterns 303, 313, and 323 in FIG. 3. The DRC verification can be any design rule verification programs available in the electronic design automation industry.

In an embodiment, the DRC verification can be performing using a conventional DRC deck. The DRC deck used in the DRC verification can include one or more databases of on-grid design rules, and each layout pattern of the layout design verified by the DRC verification must be on-grid, otherwise the DRC verification will issue an error. In the embodiment, the use of an existing DRC deck to perform the DRC verification will eliminate the need to re-evaluate or revalidate new developed DRC decks, thereby saving time and resource of developing a new DRC deck and reducing design verification costs.

Embodiments of the present invention provide a method for DRC layout verification that includes the identification of off-grid patterns in a layout design and conversion of the identified off-grid patterns into corresponding on-grid patterns. Thus, in accordance with the present invention, off-grid patterns can be designed as needed, the off-grid patterns will be identified and converted to corresponding on-grid patterns, and a DRC verification can be performed on the converted on-grid patterns using an existing DRC file to save time and resource, and reduce costs.

FIG. 4 is a flow chart illustrating a method 400 for DRC verification of a design file having on-grid and off-grid patterns. Method 400 may include:

S101: identify an off-grid pattern;

S102: convert the identified off-grid pattern to corresponding on-grid patterns. The conversion may includes: outwardly expanding edges of the off-grid pattern that are not arranged on the grid to adjacent grids to form a corresponding first on-grid pattern; and inwardly contracting the expanded edges that are now on-grid to adjacent grids to form a corresponding converted second on-grid pattern;

S103: perform a DRC verification on the converted second on-grid pattern using an existing DRC deck containing on-grid design rules.

Method 400 may further include forming a set of on-grid patterns that contains the converted first and second on-grid patterns, and labeling the set of the on-grid patterns.

In the embodiment, the sum of the first width of the converted first on-grid pattern and the second width of the converted second on-grid pattern having the same height is two times the width of the off-grid pattern corresponding to the same height.

In one embodiment, the on-grid patterns (i.e., patterns having edges arranged on the grid) are not submitted to the expanding or contracting conversion. In other words, the on-grid patterns remain unchanged.

Method 400 may also include backing up the layout design after identifying an off-grid pattern. The backup may include making a backup copy and storing the backup copy on a storage device.

Figure 5:
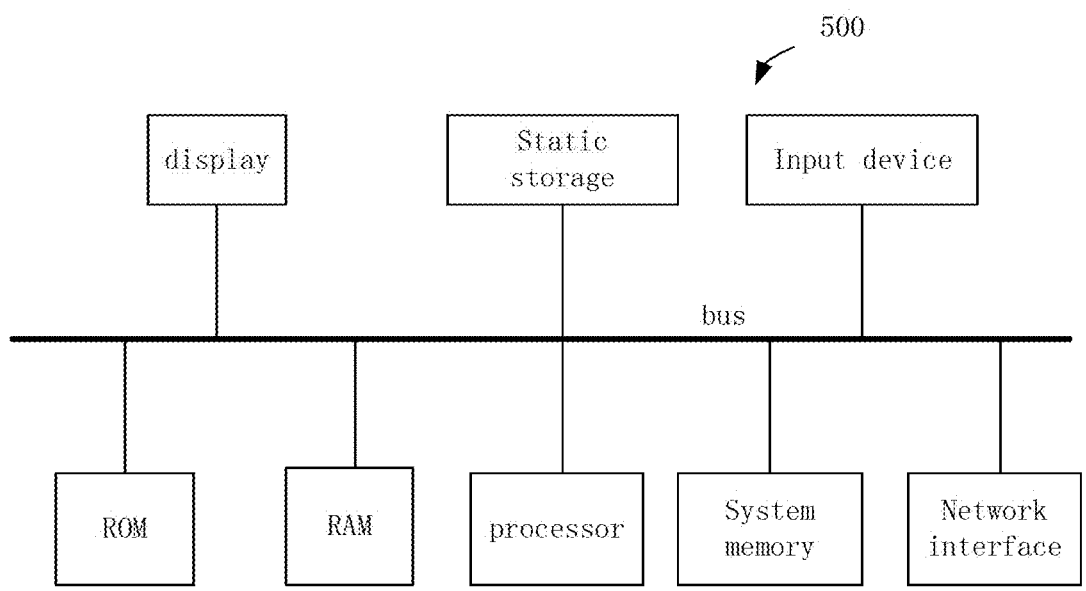
FIG. 5 is a simplified block diagram of a computing apparatus that may be programmed to execute codes for performing a DRC verification on an IC layout design according to one embodiment of the present invention.

FIG. 5 is a simplified block diagram of a computing apparatus 500 that may be programmed to execute codes for performing a DRC verification on an IC layout design according to one embodiment of the present invention. As shown, computing apparatus 500 includes a processor having one or more processing units, a system memory, static storage units (hard drive), a display unit (LCD), an input device (keyboard, mouse, optical disc or magnetic tape reader, and the like). Computer apparatus 500 also includes a network interface unit configured to connect the computing apparatus with other devices through a local area network, a wide area network, or a wireless network. In an embodiment, the display unit has one or more windows for displaying identified off-grid patterns, converted first and second on-grid patterns, and one or more input fields for a user (e.g., layout designer) to modify the off-grid patterns and to complete the DRC verification. Embodiments of the present invention provide a novel method for performing a DRC verification of an IC layout design. Embodiments of the present invention use the results of the DRC verification as a guidance to manufacture an IC device.

Embodiments of the present invention provide many advantages that may include automatically identifying off-grid patterns in a layout design, converting the off-grid patterns into first and second on-grid patterns, and performing a DRC verification on the converted first and second on-grid patterns. An automatic backup of the layout design can also be performed, in accordance with the present invention.

Functions and algorithms performed by the computing apparatus shown in FIG. 5 may include receiving a layout design file of an IC device, identifying off-grid patterns present in the layout design file, converting the identified off-grid patterns into corresponding on-grid patterns, and forming the on-grid patterns into associated sets, and assigning labels to the sets.

Embodiments for implementation of the systems and methods of the present invention may comprise a special-purpose or general-purpose computer (not shown) including computer hardware and/or software components that further include computer readable media for carrying out or containing computer-executable instructions or data structures. Computer-executable instructions include, for example, instructions and data which cause a special-purpose or general-purpose computer to perform a certain function or group of functions. Computer-readable media can include any available media that can be accessed by a general-purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of computer-executable instructions or data structures, or that can be used to store information or data, and that can be accessed by a special-purpose or general-purpose computer.

While the advantages and embodiments of the present invention have been depicted and described, there are many more possible embodiments, applications and advantages without deviating from the spirit of the inventive ideas described herein. It will be apparent to those skilled in the art that many modifications and variations in construction and widely differing embodiments and applications of the present invention will suggest themselves without departing from the spirit and scope of the invention.

It is to be understood that the above description is intended to be illustrative and not restrictive. Many embodiments will be apparent to those of skill in the art upon reviewing the above description. The scope of the invention should, therefore, be determined not with reference to the above description, but instead should be determined with reference to the appended claims along with their full scope of equivalents.

What is claimed is:

1. A computer-implemented method for performing a design rule check (DRC) verification on a layout design comprising off-grid patterns and on-grid patterns, the method comprising:
   identifying an off-grid pattern having one or more off-grid edges using a computer;
   outwardly expanding the one or more off-grid edges to first adjacent grid lines to obtain a first on-grid pattern having first on-grid edges;
   inwardly contracting the first on-grid edges of the first on-grid pattern to second adjacent grid lines to obtain a second on-grid pattern having second on-grid edges; and
   performing a DRC verification on the second on-grid pattern using the computer, wherein a sum of a first width of the first on-grid pattern and a second width of the second on-grid pattern that have a same height is two times a width of the off-grid pattern corresponding to the same height.

2. The computer-implemented method of claim 1, wherein identifying the off-grid pattern comprises the use of software tools.

3. The computer-implemented method of claim 1, further comprising labeling the identified off-grid pattern.

4. The computer-implemented method of claim 1, further comprising:
   forming a set of on-grid patterns comprising the first on-grid pattern and the second on-grid pattern; and
   labeling the set of on-grid patterns.

5. The computer-implemented method of claim 1, wherein edges of the identified off-grid pattern that are originally on-grid are not outwardly expanded or inwardly contracted.

6. The computer-implemented method of claim 1, wherein no expansion or contraction is performed on edges of the identified off-grid pattern that are originally on-grid.

7. The computer-implemented method of claim 1, wherein performing the DRC verification comprises the use of a DRC file containing only on-grid design rules.

8. The computer-implemented method of claim 1, further comprising performing a backup of the layout design after identifying the off-grid pattern and prior to expanding the off-grid edges.

9. The computer-implemented method of claim 8, wherein performing the backup comprises:
   making a backup copy; and
   storing the backup copy on a backup storage device, wherein making and storing the backup copy are automatically performed by a software program running on the computer.

10. A non-transitory computer readable storage medium for performing a DRC verification on an IC layout design including a plurality of off-grid patterns and on-grid patterns, the computer readable storage medium comprising instructions which, when executed by a processor, cause the processor to:
   identify an off-grid pattern having one or more off-grid edges;
   outwardly expand the one or more off-grid edges to first adjacent grid lines to obtain a first on-grid pattern having first on-grid edges;
   inwardly contract the first on-grid edges of the first on-grid pattern to second adjacent grid lines to obtain a second on-grid pattern having second on-grid edges; and perform a DRC verification on the second on-grid pattern, wherein a sum of a first width of the obtained first on-grid pattern and a second width of the obtained second on-grid pattern that have a same height is two times a width of the off-grid pattern corresponding to the same height.

\* \* \* \* \*